United States Patent
Liao

[11] Patent Number: 6,051,153
[45] Date of Patent: Apr. 18, 2000

[54] ETCHING METHOD

[75] Inventor: Kuan-Yang Liao, Taipei, Taiwan

[73] Assignee: United Silicon Incorporated, Hsinchu, Taiwan

[21] Appl. No.: 09/075,297

[22] Filed: May 8, 1998

[30] Foreign Application Priority Data

Apr. 8, 1998 [TW] Taiwan ................................ 87105249

[51] Int. Cl.$^7$ .............................. H01L 21/302; C23F 1/12
[52] U.S. Cl. ............................. 216/79; 216/75; 438/696; 438/715
[58] Field of Search .................... 438/696, 715; 216/79, 75

[56] References Cited

U.S. PATENT DOCUMENTS 5,296,095 3/1994 Nabeshima et al. ..................... 216/67
5,476,807 12/1995 Lee et al. ................................ 438/396
5,651,856 7/1997 Keller et al. ............................ 438/695

OTHER PUBLICATIONS

Takahashi K; Proc Symp. Dry Process, 1995, vol. 17th, pp. 237–242. Journal Code : Y o378A, Japan.

*Primary Examiner*—Randy Gulakowski
*Assistant Examiner*—Shamim Ahmed
*Attorney, Agent, or Firm*—Christie, Parker & Hale, LLP

[57] ABSTRACT

A method for etching. The etching process is to form an opening within the material layer on the substrate and then form a patterned layer on the material layer. An etching gas, an inert gas/hydrogen and an inert gas are pumped into the chamber. The inert gas is used to decrease the surface temperature of the patterned layer and a polymer thin film layer can be formed easily on the surface of the patterned layer. The opening is then formed by defining the material layer with the patterned layer. In addition, the thin film can not be formed on the bottom of the opening by raising the temperature of the substrate.

13 Claims, 2 Drawing Sheets

ETCHING METHOD

CROSS-REFERENCE TO RELATED APPLICATION

This application claims priority benefit of Taiwan application Ser. No. 87105249, filed Apr. 8, 1998, the full disclosure of which is incorporated herein by reference.

BACKGROUND OF THE INVENTION

1. Field of the Invention

The invention relates to a method for etching, and more particularly to a method for etching with high etch selectivity.

2. Description of the Related Art

As device size of the integrated circuits decreases, the width of the contact hole and the opening becomes narrower, and the aspect ratio of the contact increases correspondingly. FIG. 1 is a cross sectional view of contact formed by a conventional etching process. In the prior art of an etching process, $C_xH_yF_z$ usually serves as an etching gas, to be pumped into the chamber to etch the oxide layer 102 on the substrate 100. Other gases further contain He/$O_2$, hydrogen ($H_2$), carbon oxygen (CO), etc. A contact hole 106 is next defined by forming a photoresist layer 104 on the oxide layer 12. However, due to the presence of hydrogen atoms in $C_xH_yF_z$, it is difficult to control the C/F ratio in the reactive gas and polymerization is hence hard to control, too. Therefore, either it is hard to form a enough polymer thin film on the surface of the photoresist 104 and the contact hole 106, or the contact hole 106 is clogged by the polymer thin film. The etching process of contact can't be continuously performed. Oxygen in the He/$O_2$ is useful to reduce the polymerization reaction in the formation of a polymer thin film on the surface of the photoresist 104 and the sidewalls of the contact hole 106. Hydrogen induces the formation of HF and results in higher C/F ratio in the chamber environment which increases the formation of polymer. But when oxygen and hydrogen are mixed together, the process becomes much more dangerous. Obviously, the safety of the process becomes more and more important.

SUMMARY OF THE INVENTION

It is therefore an object of the invention to form a thin film on the surface of the patterned layer and the sidewalls of the opening when the etching process is performed to prevent unnecessary etching, where the bottom of the opening is not clogged by the thin film and therefore the success of the etching process is assured. Furthermore, an inert gas is pumped into the chamber to reduce the potential danger of the process.

To achieve these objects and advantages, and in accordance with the purpose of the invention, as embodied and broadly described herein, the invention is directed towards a method for etching. The etching process is to form an opening within a material layer on the substrate. A patterned layer is then formed on the material layer. An etching gas, inert gas/hydrogen and an inert gas are pumped into the chamber. The inert gas is used to lower the surface temperature of the patterned layer so that a polymer thin film layer can be formed easily on the surface of the patterned layer due to low temperature. The opening is formed by defining the material layer with the patterned layer. In addition, the thin film is not formed on the bottom of the opening by raising the temperature of the substrate.

It is to be understood that both the foregoing general description and the following detailed description are exemplary and explanatory only and are not restrictive of the invention, as claimed.

DESCRIPTION OF THE PREFERRED EMBODIMENTS

Figure 1:
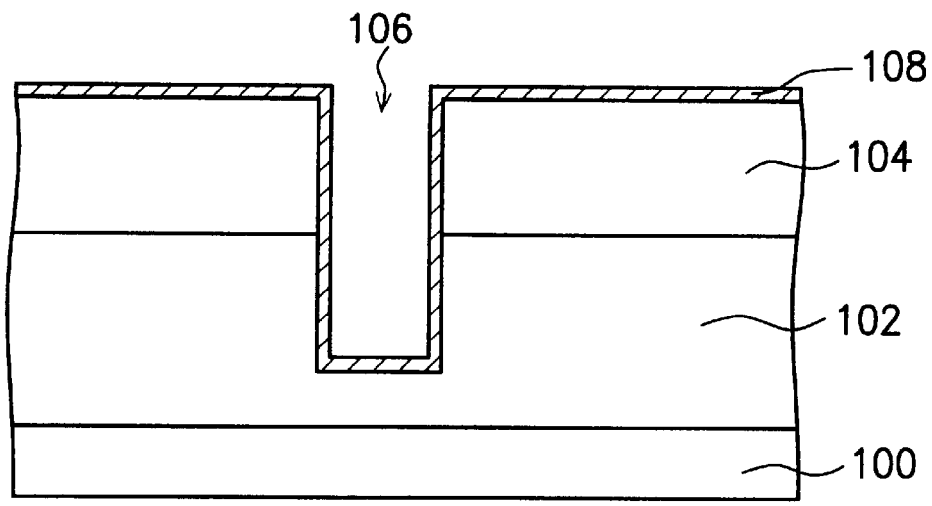
FIG. 1 is a cross sectional view of an opening according to a conventional etching process.
Figure 2:
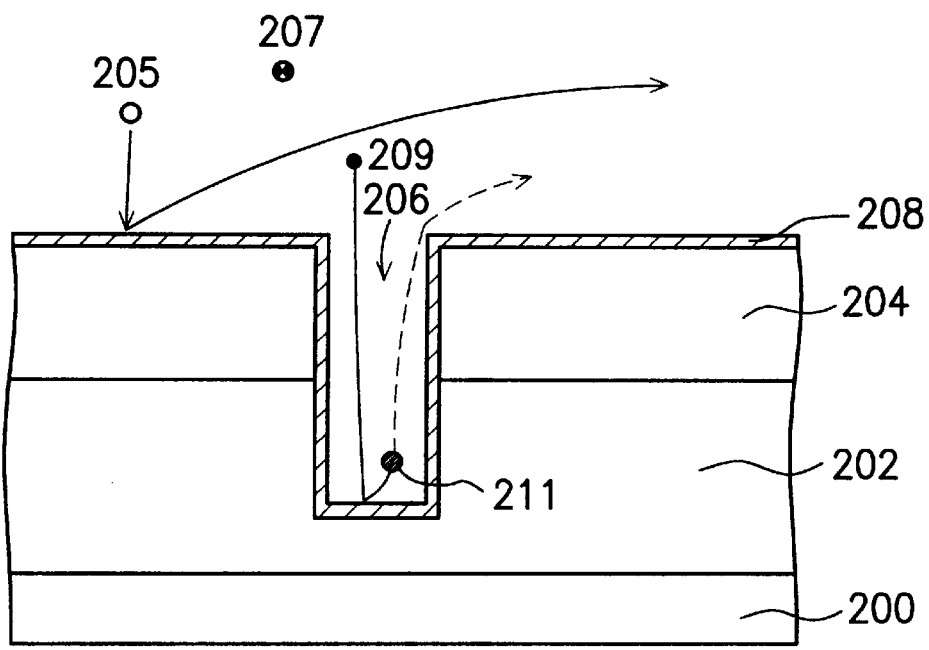
FIG. 2 is a cross sectional view of an opening according to an etching process of a preferred embodiment of the invention.

Referring to FIG. 2, a material layer 202 is formed on a substrate 200 and a patterned layer 204 is next formed on the material layer 202. A source gas, which at least contains an inert gas 205, an inert gas/hydrogen 207 and an etching gas are pumped into a chamber. The material layer 202 includes oxide, metal or polysilicon. The inert gas, such as helium, and the etching gas, such as $C_xF_y$, is also used. An opening 206 is defined by etching with the etching gas and as a result a thin film 208 is formed both on the surface of the opening 206 and the patterned layer 204. The opening 206 and the patterned layer 204 can be protected by the formation of the thin film 208 from unnecessary etching.

The surface temperature of the patterned layer 204 is reduced by the inert gas 205. The etching rate for etching the patterned layer 204 is therefore decreased and the sticking coefficient of the thin film can be increased because of the lower surface temperature of the patterned layer 204. The ionization of inert gas is very high and then will not affect the ionization rate of etching gas. The etching gas 209 is also diluted by the inert gas 205 and there is a reduction in the resident time of ions that ionized from the etching gas 209. Therefore, the resident time is not long enough to achieve a pure chemical reaction on the sidewalls. In addition, the ion bombardment of the etching gas on the sidewalls of the opening doesn't have enough energy, so there are fewer chances for the etching gas to etch the sidewalls of the opening 206. The temperature of the substrate 200 is raised to decrease the sticking coefficient and the by-product 211 in the bottom of the opening 206 is hence pumped out easily. The ions from the etching gas can therefore continue to etch the bottom of the opening 206.

Figure 3:
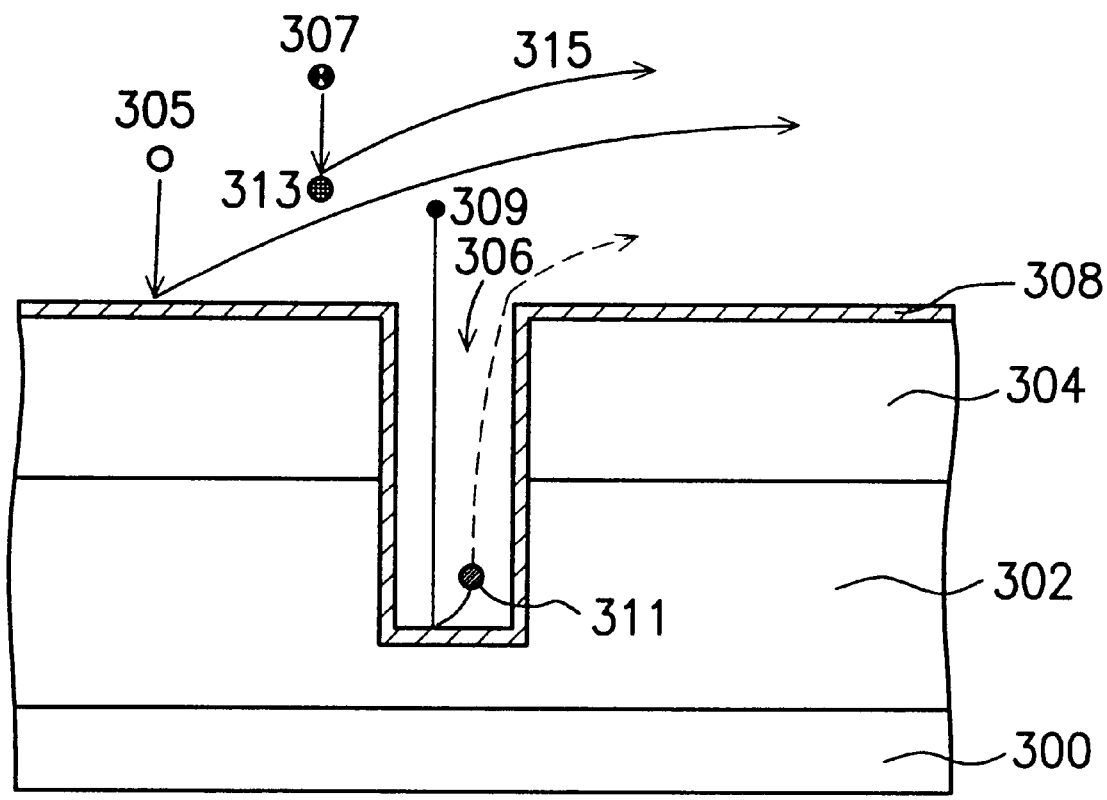
FIG. 3 is a cross sectional view of an opening according to an etching process of a preferred embodiment of the invention, using an oxide layer as a material layer, He as an inert gas and $C_xF_y$ as an etching gas.

Referring to FIG. 3, a material layer, such as an oxide layer 302 which is formed on the substrate 300, an inert gas, such as helium 305, and an etching gas, such as $C_xF_y$, is used. After ionization of hydrogen, hydrogen atom or hydrogen ion 307 is slammed into the fluorine of $C_xF_y$ to form hydrogen fluorine (HF) and HF is then pumped out with a pump. Thus, C/F ratio of the gases in the chamber increases and enhances the formation of polymer to protect opening 306. $C_xF_y$ can be ionized to form $CF_x^+$ 309 which is the source of polymerization and oxide layer 302 etching. In addition, as the etching process is performed, the surface temperature of the patterned layer 304 is reduced by large amount of helium. Helium has better thermal conductivity to remove heat from the surface. The lower surface temperature of the patterned layer 304 not only decreases the etching rate but also increases the sticking coefficient of the polymer thin film 308 formed from $C_xF_y$. Because of the reducing temperature of the patterned layer 304, the polymer thin film can be easily formed on both the surface of the oxide layer 302 and the sidewalls of the opening 306. The polymer thin film is used to protect the sidewalls of the contact hole 306 and the patterned layer surface from etching by etching gas. $C_xF_y$ 309 is diluted by helium 305 and the resident time of $CF_x^+$ that is ionized from $C_xF_y$ 309 is reduced. Therefore, the resident time is not long enough to achieve the pure chemical reaction which induces isotropic etch. In addition, the $CF_x^+$ bombardment of $C_xF_y$ 309 on the sidewalls of the opening doesn't have enough energy, so $C_xF_y$ 309 has fewer chances to etch the sidewalls of the opening 306. The temperature of the substrate 300 is raised to decrease the sticking coefficient of the polymer and the by-product 311 in the bottom of the opening 306 and hence both can be pumped out easily. The oxide etching can be continued on the bottom of the opening 306

The hydrogen of inert gas/hydrogen is used to enhance the formation of the thin film on the surface of the patterned layer and the sidewalls of the opening. The inert gas of inert gas/hydrogen is used to dilute the hydrogen concentration and to reduce the potential danger from the reaction of the hydrogen. The preferred operation condition of the method for etching includes a source gas, which at least contains an inert gas, an inert gas/hydrogen and an etching gas. The flow rate of the inert gas is in a range of about 50 sccm to 500 sccm, the flow rate of the inert gas/hydrogen is in a range of about 10 sccm to 100 sccm, and the flow rate of the etching gas is in a range of about 20 sccm to 500 sccm. The power of a machine is in a range of about 30 W to 3000 W, the temperature of a wafer needs be higher than 100° C., the pressure of the chamber is in a range of about 0.1 mtorr to 100 mtorr, and the temperature of the chamber is in a range of about 50° C. to 300° C.

Other embodiment of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for etching, wherein a material layer is formed on a substrate, and a patterned layer is formed on the material layer, comprising:

pumping a source gas into a chamber, wherein the source gas comprises an inert gas, an inert gas/hydrogen mixture and an etching gas, wherein the inert gas is used to reduce surface temperature of the patterned layer; and increasing the temperature of the substrate;

patterning the material layer, using the patterned layer as a mask, to form an opening, wherein the opening has a bottom and sidewalls, wherein a thin film is formed on the patterned layer and the sidewalls of the opening, but not on the bottom of the opening.

2. The method according to claim 1, wherein the inert gas comprises helium.

3. The method according to claim 1, wherein the etching gas comprises $C_xF_y$.

4. The method according to claim 1, wherein the etching gas comprises $Cl_2$.

5. The method according to claim 1, wherein the material layer comprises polysilicon.

6. The method according to claim 1, wherein the material layer comprises metal.

7. The method according to claim 1, wherein the material layer comprises oxide.

8. The method according to claim 1, wherein the thin film comprises polymer.

9. A method for etching, wherein an oxide layer is formed on a substrate and a photoresist layer is formed on the oxide layer, comprising:

pumping a source gas into a chamber, the source gas comprising an inert gas, an inert gas/hydrogen mixture and an etching gas, wherein the inert gas is used to reduce the surface temperature of the patterned layer; and increasing temperature of the substrate;

patterning the material layer, using the photoresist layer as a mask, to form a contact hole, wherein the contact hole has a bottom and sidewalls and a thin film is formed on the patterned layer and the sidewalls of the opening, but not on the bottom of the contact hole.

10. The method according to claim 9, wherein the inert gas comprises helium.

11. The method according to claim 9, wherein the etching gas comprises $C_xF_y$.

12. The method according to claim 9, wherein the thin film comprises polymer.

13. A method for etching according to claims 1 or 9, operative conditions of the method comprising:

a source gas, which comprises an inert gas, an inert gas/hydrogen and an etching gas, wherein the flow rate of the inert gas is in a range of about 50 sccm to 500 sccm, the flow rate of the inert gas/hydrogen is in a range of about 10 sccm to 100 sccm and the flow rate of the etching gas is in a range of about 20 sccm to 500 sccm;

a machine power of about 30 W to 3000 W;

a wafer temperature higher than 100° C.;

a chamber pressure of about 0.1 mtorr to 100 mtorr; and a chamber temperature of 50° C. to 300° C.

* * * * *